United States Patent
Yamada et al.

(10) Patent No.: US 9,885,762 B2
(45) Date of Patent: Feb. 6, 2018

(54) MAGNETIC SHIELDED PACKAGE HAVING MAGNETIC SHIELD MEMBERS

(71) Applicant: KABUSHIKI KAISHA TOSHIBA, Tokyo (JP)

(72) Inventors: Keiju Yamada, Kanagawa (JP); Mikiya Iida, Kanagawa (JP); Kei Masunishi, Kanagawa (JP); Kazuo Shimokawa, Kanagawa (JP); Hideaki Fukuzawa, Kanagawa (JP); Michiko Hara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 14/870,817

(22) Filed: Sep. 30, 2015

(65) Prior Publication Data
US 2016/0091575 A1  Mar. 31, 2016

(30) Foreign Application Priority Data

Sep. 30, 2014 (JP) .................................. 2014-202632

(51) Int. Cl.
*G01R 33/00* (2006.01)
*G01R 33/09* (2006.01)
*G01R 33/025* (2006.01)

(52) U.S. Cl.
CPC ..... *G01R 33/0017* (2013.01); *G01R 33/0047* (2013.01); *G01R 33/0076* (2013.01); *G01R 33/025* (2013.01); *G01R 33/093* (2013.01); *H01L 2224/48137* (2013.01); *H01L 2224/49109* (2013.01); *H01L 2924/16152* (2013.01)

(58) Field of Classification Search
CPC ............ G01R 33/0017; G01R 33/0076; G01R 33/025; G01R 33/093; G01R 33/0047
USPC ............................................ 324/225; 438/51
See application file for complete search history.

(56) References Cited

U.S. PATENT DOCUMENTS

| | | |
|---|---|---|
| 2006/0180880 A1 | 8/2006 | Wang et al. |
| 2007/0205492 A1* | 9/2007 | Wang .................... B81C 1/0023 257/659 |

(Continued)

FOREIGN PATENT DOCUMENTS

| | | |
|---|---|---|
| JP | 57-111427 | 7/1982 |
| JP | 2003-309196 | 10/2003 |

(Continued)

OTHER PUBLICATIONS

Office Action of the Intellectual Property Office dated May 16, 2016, in counterpart Taiwanese Patent Application No. 104132266 issued by the Taiwanese Intellectual Property Office; 9 pages.

*Primary Examiner* — Billy Lactaoen
(74) *Attorney, Agent, or Firm* — Finnegan, Henderson, Farabow, Garrett & Dunner, L.L.P.

(57) ABSTRACT

A magnetic shielded package includes a magnetic device, a first magnetic shield member, and a second magnetic shield member. The first magnetic shield member is disposed below the magnetic device. The second magnetic shield member is disposed on the first magnetic shield member so as to cover the magnetic device. An opening portion is formed in the first magnetic shield member (i) at such a position as not to be adjacent to an outer circumference of the first magnetic shield member or (ii) an upper wall of the second magnetic shield member.

9 Claims, 7 Drawing Sheets

(56) References Cited

U.S. PATENT DOCUMENTS

| | | | |
|---|---|---|---|
| 2009/0057885 A1* | 3/2009 | Theuss | B81C 1/0023 |
| | | | 257/723 |
| 2010/0109103 A1 | 5/2010 | Tsao | |
| 2013/0059409 A1* | 3/2013 | Wang | H04R 19/005 |
| | | | 438/51 |
| 2014/0069200 A1 | 3/2014 | Yuasa et al. | |
| 2014/0137658 A1 | 5/2014 | Higashi et al. | |
| 2016/0093796 A1 | 3/2016 | Arai | |

FOREIGN PATENT DOCUMENTS

| | | |
|---|---|---|
| JP | 2009-36579 | 2/2009 |
| JP | 2014-52360 | 3/2014 |
| JP | 2014-103539 | 6/2014 |
| JP | 2016-72493 | 5/2016 |
| TW | 200929501 | 7/2009 |
| TW | 201019453 | 5/2010 |
| TW | 201126660 | 8/2011 |
| WO | WO 2011/111789 A1 | 9/2011 |

* cited by examiner

MAGNETIC SHIELDED PACKAGE HAVING MAGNETIC SHIELD MEMBERS

CROSS-REFERENCE TO RELATED APPLICATION(S)

The present disclosure claims priority to Japanese Patent Application No. 2014-202632, filed on Sep. 30, 2014, which is incorporated herein by reference in its entirety.

BACKGROUND

Field

Exemplary embodiments of the invention generally relate to a magnetic shielded package.

Related Art

Sensors using magnetic devices are affected by external magnetic noise. Then, there has been proposed a magnetic shielded package in which a magnetic shield member encloses a magnetic device to lower the influence of external magnetic noise on a sensor.

SUMMARY

Where a pressure detection device for detecting acoustic waves is provided in a magnetic shielded package, if an opening is not formed in the magnetic shielded package at a proper position, acoustic waves cannot propagate efficiently into the package and high-sensitivity pressure detection cannot be attained.

One exemplary embodiment of the invention provides a magnetic shielded package capable of increasing the sensitivity of a sensor while lowering the influence of external magnetic noise.

According to one exemplary embodiment, a magnetic shielded package includes a magnetic device, a first magnetic shield member, and a second magnetic shield member. The first magnetic shield member is disposed below the magnetic device. The second magnetic shield member is disposed on the first magnetic shield member so as to cover the magnetic device. An opening portion is formed in the first magnetic shield member (i) at such a position as not to be adjacent to an outer circumference of the first magnetic shield member or (ii) an upper wall of the second magnetic shield member.

DETAILED DESCRIPTION

Exemplary embodiments of the invention will be hereinafter described with reference to the accompanying drawings.

(First Exemplary Embodiment)

Figure 1A:
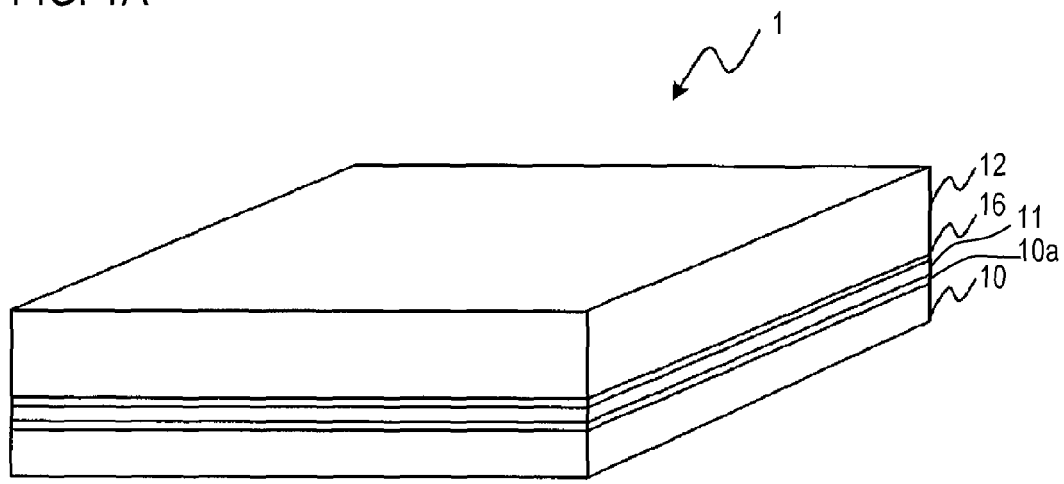
FIGS. 1A and 1B show a magnetic shielded package according to a first exemplary embodiment of the invention.
Figure 1B:
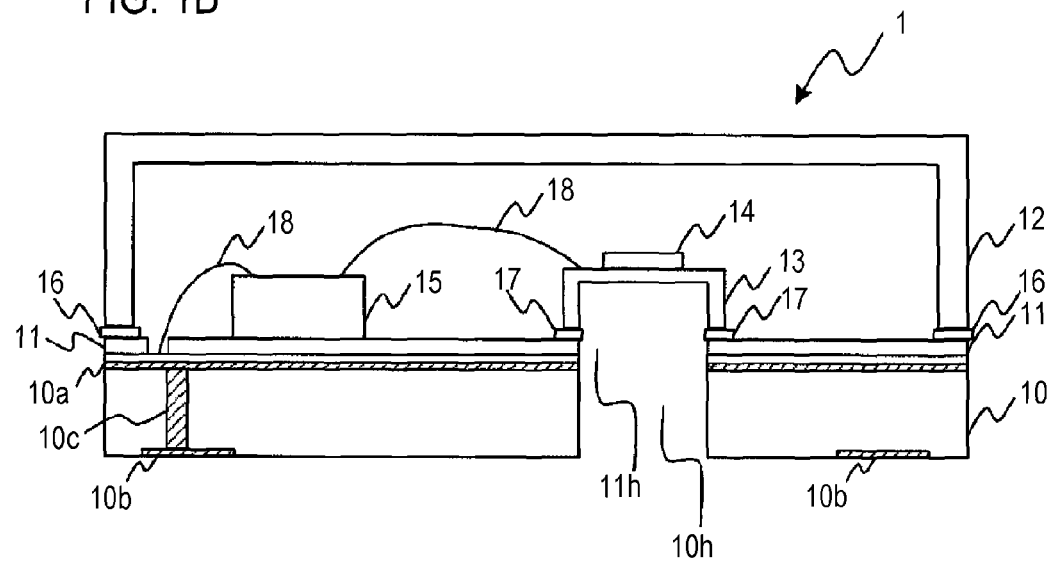
Figure 2:
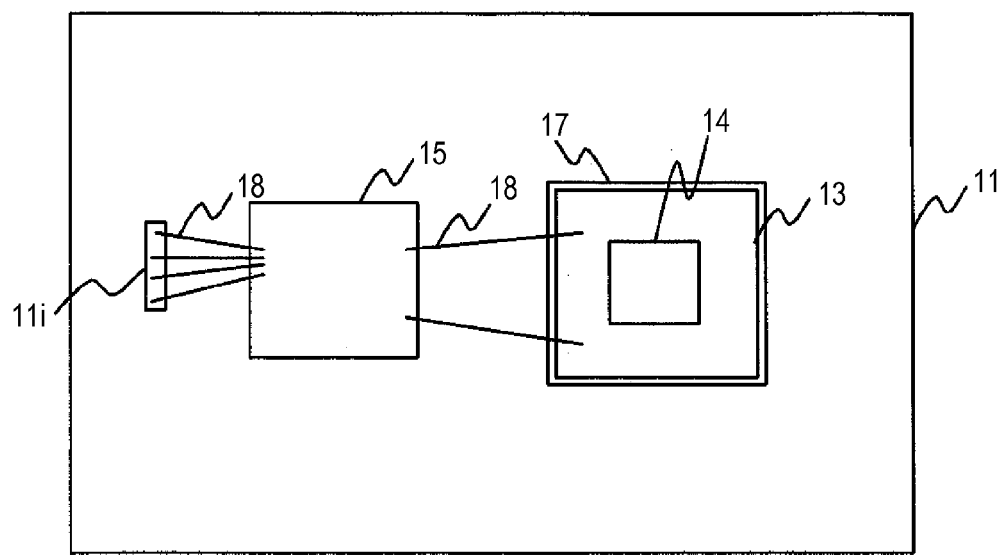
FIG. 2 shows the magnetic shielded package according to the first exemplary embodiment.

FIG. 1A is a perspective view of a magnetic shielded package 1 according to a first exemplary embodiment of the invention. FIG. 1B is a sectional view of the magnetic shielded package 1 according to the first exemplary embodiment. The magnetic shielded package 1 according to the first exemplary embodiment includes a package board 10, a first magnetic shield member 11, a second magnetic shield member 12, a pressure detection element 13, a magnetic device 14, and an integrated circuit 15. FIG. 2 is a top view of the magnetic shielded package 1 from which the second magnetic shield member 12 is removed.

The magnetic shielded package 1 is used for converting acoustic waves, for example, into an electrical signal. The magnetic device 14 is a device, such as a GMR (giant magnetoresistance) device, whose electrical characteristic such as resistance varies in accordance with an external magnetic field or external pressure. The magnetic device 14 is disposed on the pressure detection element 13.

The pressure detection element 13 is, for example, a MEMS (microelectromechanical system) element produced by processing a silicon material. The pressure detection element 13 vibrates when receiving, for example, acoustic waves from the outside. When the pressure detection element 13 vibrates, stress acts on the magnetic device 14 and the electrical characteristic of the magnetic device 14 such as resistance varies. In this manner, acoustic waves, for example, can be converted into an electrical signal.

The electrical characteristic of the magnetic device 14 also varies under the influence of extraneous magnetic noise. In view of this, the inside of the magnetic shielded package 1 is shielded magnetically by the first magnetic shield member 11 and the second magnetic shield member 12. This measure lowers the influence of extraneous magnetic noise on the magnetic device 14. However, if the pressure detection element 13 and the magnetic device 14 are completely enclosed by the first magnetic shield member 11 and the second magnetic shield member 12, acoustic waves cannot propagate into the package 1 efficiently. This is the reason why an opening portion 11h is formed through the first magnetic shield member 11. The opening portion 11h will be described later in detail.

Next, the structure of the magnetic shielded package 1 will be described. The package board 10 is, for example, a glass epoxy board made of a material such as FR4. The package 10 includes a single wiring layer or plural wiring layers. The package board 10 may be either of an LGA (land grid array) type, a BGA (ball grid array) type, SON (small outline no lead) type or QFN (quad flatpack no lead). The package board 10 shown in FIG. 1 is of the LGA type. The package board 10 is provided with a first wiring layer 10*a* and a second wiring layer 10*b*. The second wiring layer 10*b* serves as electrodes. The first wiring layer 10*a* and the second wiring layer 10*b* are connected to each other by vias 10*c*.

The first magnetic shield member 11 and the second magnetic shield member 12 are disposed on the package board 10. The plate-like first magnetic shield member 11 is bonded to the package board 10. The second magnetic shield member 12 is disposed on the first magnetic shield member 11 so as to cover an upper portion and side surfaces of the magnetic device 14. The first magnetic shield member 11 and the second magnetic shield member 12 together surround the magnetic device 14. In FIG. 1, the first magnetic shield member 11 has a plate-like shape, and the second magnetic shield member 12 is shaped like a rectangular parallelepiped one surface of which is removed. However, it should be noted that the shapes of the first magnetic shield member 11 and the second magnetic shield member 12 are not limited thereto. The first magnetic shield member 12 and the second magnetic shield member 13 may have any shape so long as the magnetic device 14 be surrounded by the first magnetic shield member 11 and the second magnetic shield member 12.

Examples of materials of the first magnetic shield member 11 and the second magnetic shield member 12 include soft magnetic materials such as iron, carbon steel, silicon steel, and permalloy. The materials of the first magnetic shield member 11 and the second magnetic shield member 12 may be either the same as each other or different from each other.

The magnetic shielding effect of the magnetic shielded package 1 is determined by the relative permeabilities μr and the thicknesses tm of the first magnetic shield member 11 and the second magnetic shield member 12. Where the thickness tm of a magnetic shield member is expressed in millimeter, a magnetic shielding effect of 10 dB or more can be obtained if the product of its relative permeability μr and thickness tm is set to be equal to or larger than 10.

For example, the first magnetic shield member 11 and the second magnetic shield member 12 are bonded to each other with a first adhesive 16. If the first adhesive 16 contains, for example, magnetic particles whose relative permeability is equal to or larger than 2, a magnetic path of the first magnetic shield member 11 and a magnetic path of the second magnetic shield member 12 are connected to each other and hence the magnetic shielding effect thereof can be enhanced.

Figure 3:
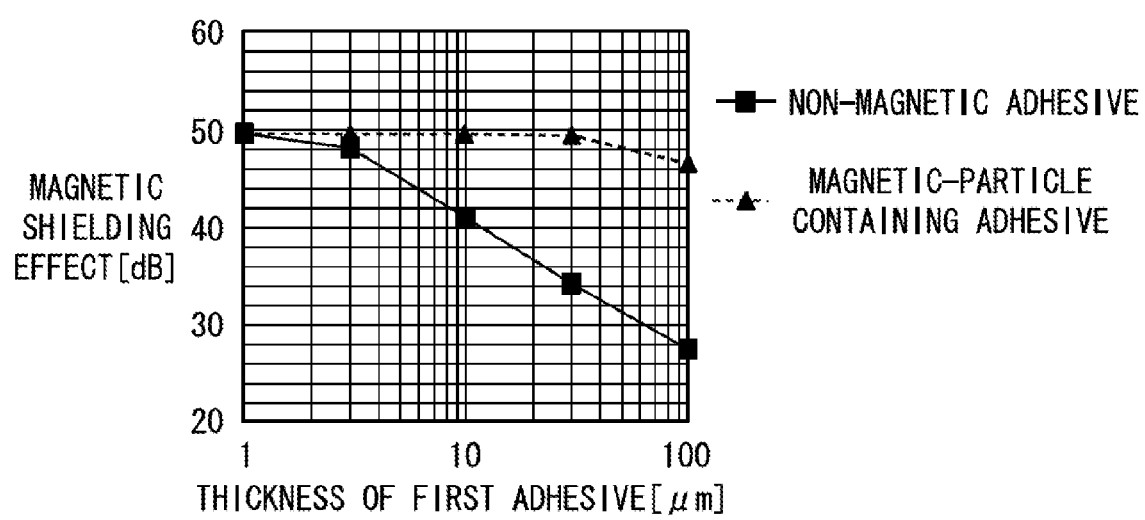
FIG. 3 is a graph showing a relationship between the thickness of a first adhesive of the magnetic shielded package according to the first exemplary embodiment and a magnetic shielding effect of the magnetic shielded package.

FIG. 3 is a graph showing a relationship between the thickness of the first adhesive 16 and the magnetic shielding effect. A comparison was made between a case where a non-magnetic adhesive was used as a first adhesive and a case where an adhesive containing magnetic particles whose relative permeability is 20 was used as the first adhesive 16. Where the first adhesive was the non-magnetic adhesive, the magnetic shielding effect was equal to or lower than 48 dB when the thickness of the first adhesive was equal to or greater than 3 μm and was equal to 34 dB when the thickness of the first adhesive 16 was equal to 30 μm. On the other hand, when the first adhesive 16 was the adhesive containing magnetic particles, a pronounced magnetic shielding effect of 48dB or larger was obtained when the thickness of the first adhesive 16 was equal to or smaller than 30 μm. It is seen from these comparison results that the first adhesive 16 being an adhesive containing magnetic particles provides a better magnetic shielding effect than the adhesive 16 being a non-magnetic adhesive.

Examples of the magnetic particles to make up the first adhesive 16 include microparticles of 1 μm to several tens of micrometers in diameter, nanoparticles of several nanometers to several tens of nanometers in diameter, and mixtures thereof. Examples of the microparticles include iron microparticles, iron or nickel-based microparticles such as permalloy, ferrite, and sendust. Examples of the nanoparticles include nanoparticles of iron, iron oxide, and iron-platinum. Examples of a binder for the particles include an epoxy resin and silicone. The binder may be selected so as to provide good joining performance between the first magnetic shield member 11 and the second magnetic shield member 12. Other examples of the first adhesive 16 include (i) non-acidic adhesives such as silicone, (ii) insulative adhesives, and (iii) conductive adhesives such as silver paste and solder.

Instead of bonding the first magnetic shield member 11 and the second magnetic shield member 12 to each other with an magnetic-particle-containing adhesive having 2 or more in relative permeability, the first magnetic shield member 11 and the second magnetic shield member 12 may be bonded to each other with a double-sided adhesive tape, for example.

The pressure detection element 13 is disposed on the first magnetic shield member 11. The pressure detection element 13 and the first magnetic shield member 11 are bonded to each other, with a second adhesive 17. Examples of the second adhesive 17 include (i) non-magnetic adhesives (that do not contain any magnetic particles) such as silicone, (ii) insulators, and (iii) non-magnetic, conductive adhesives such as silver paste and solder.

One or plural magnetic devices 14 are disposed on the pressure detection element 13. The sensitivity to acoustic waves can be enhanced by providing plural magnetic devices 14. The magnetic device 14 is electrically connected to the integrated circuit 15 by wirings 18 and/or interconnections formed on the pressure detection element 13. An analog signal produced through detection by the pressure detection element 13 and the magnetic device 14 is input to the integrated circuit 15.

The integrated circuit 15 performs signal processing on the received analog signal and outputs a resulting digital signal. The digital signal that is output from the integrated circuit 15 travels through the wirings 18, a first wiring layer 10*a* of the package board 10, and vias 10*c* of the package board 10 and is output from the electrode 10*b*. To connect the wirings 18 to the package board 10, an opening portion 11*i* is formed in the first magnetic shield member 11 as shown in FIG. 2. In this exemplary embodiment the integrated circuit 15 is disposed in a space that is enclosed by the first magnetic shield member 11 and the second magnetic shield member 12. Alternatively, the integrated circuit 15 may be disposed outside the space enclosed by the first magnetic shield member 11 and the second magnetic shield member 12.

Next, description will be given on the opening portion 11*h*, which is formed in the first magnetic shield member 11. The opening portion 11*h* is formed below the pressure detection element 13. Since the opening portion 11*h* is formed below the pressure detection element 13, acoustic waves are allowed to propagate into the magnetic shielded package 1 efficiently. An opening portion 10*h* of the package board 10 is formed below the opening portion 11*h* of the first magnetic shield member 11.

FIGS. 4A to 4D are top seethrough views each of which shows an example of the opening portion(s) 11*h* of the first magnetic shield member 11 and the opening portion 10*h* of the package board 10. In FIGS. 4A to 4D, the opening portion(s) 11h of the first magnetic shield member 11 are indicated by a solid line(s), and the opening portion 10h of the package board 10 is indicated by a broken line. For example, a circular opening portion 10h is formed in the package board 10. The opening portion(s) 11h of the first magnetic shield member 11 may be a circular opening portion (e.g., concentric with the opening portion 10h; see FIG. 4A), a set of fan-shaped opening portions (FIG. 4B), a set of circular opening portions each of which is smaller in diameter than the opening portion 10h (FIG. 4C), or a net-like opening portion including each of which is sufficiently smaller in area than the opening portion 10h.

Figure 4A:
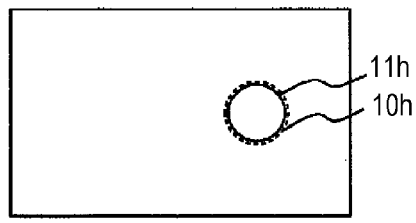
FIGS. 4A to 4D are plan seethrough views each of which shows an opening portion(s) formed in a first magnetic shield member and an opening portion formed in a package board in the magnetic shielded package according to the first exemplary embodiment.
Figure 4B:
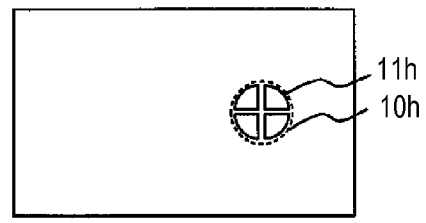
Figure 4C:
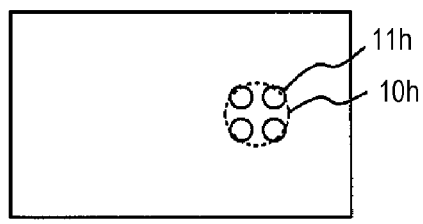
Figure 4D:
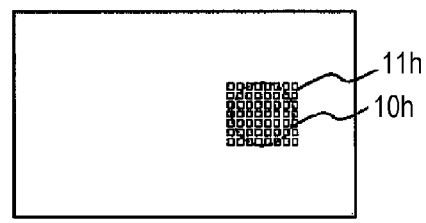

The sizes of the opening portions 11h, 10h shown in FIG. 4A are designed taking the thickness of the package board 10, the space for the diaphragm and the like into consideration so that Helmholtz resonance does not occur. Also, in the example shown in FIG. 4D, it is preferable that the size of each opening portion 11h be $1/1,000$ or more of a wavelength of maximum-frequency acoustic waves to be sensed. More specifically, where the maximum frequency is 10 kHz, the corresponding wavelength is equal to 3.4 cm. Therefore, it is preferable that the diameter or the length of the shortest side of each opening portion 11h be 34 μm or more. The shapes of the opening portions 11h, 10h are not limited to the above examples. For example, the opening portion 11h, 10h may be elliptical, polygonal, square, rectangular, rhombic, triangular, or star-like.

The opening portion 11h (or set of opening portions 11h) may be either larger or smaller than the opening portion 10h. The circular opening portions 11h, 10h shown in FIGS. 4A and 4C may be formed by drilling, punching, or etching. The opening portions 11h shown in FIGS. 4B and 4D may be formed by punching or etching.

The examples of the opening portions 11h, 10h shown in FIGS. 4A to 4D provided magnetic shielding effects of 39.8 dB, 49.4 dB, 49.5 dB, and 49.8 dB, respectively. That is, the opening portion(s) 11h having or consisting of plural opening portions each of which is smaller than the opening portion 10h can provide a better magnetic shielding effect than the circular opening portion 11h having the same diameter as the circular opening portion 10h.

For example, the magnetic shielded package 1 having the above-described configuration can be used as an acoustic sensor using a magnetic device such as a GMR device, a current sensor for measuring magnetic field strength, and a magnetic shielded package of an MRAM (magnetoresistive random access memory).

(First Modification Example of First Exemplary Embodiment)

Figure 5:
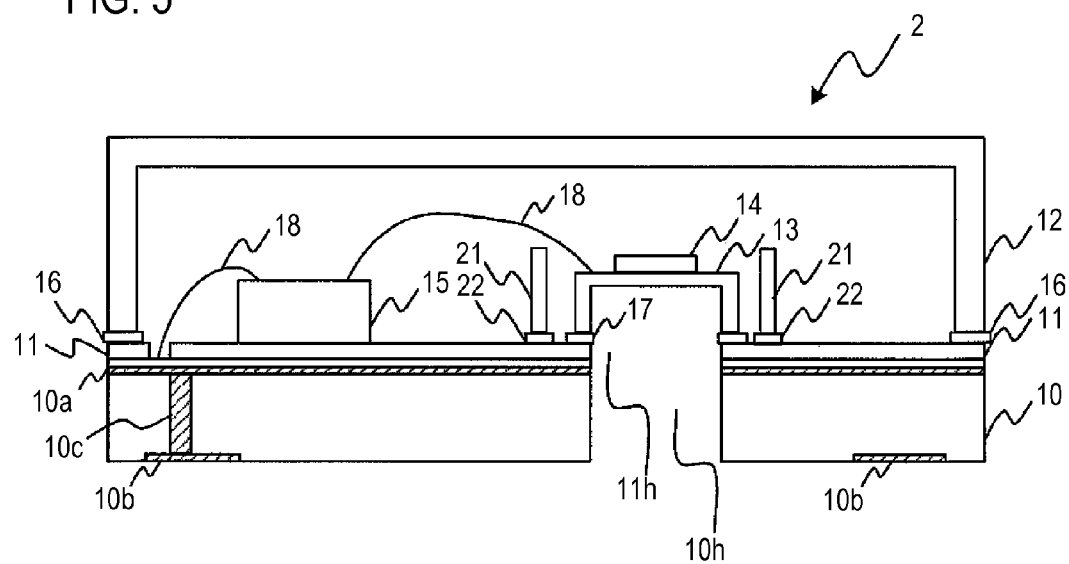
FIG. 5 is a sectional view of a magnetic shielded package according to a first modification example of the first exemplary embodiment.
Figure 6:
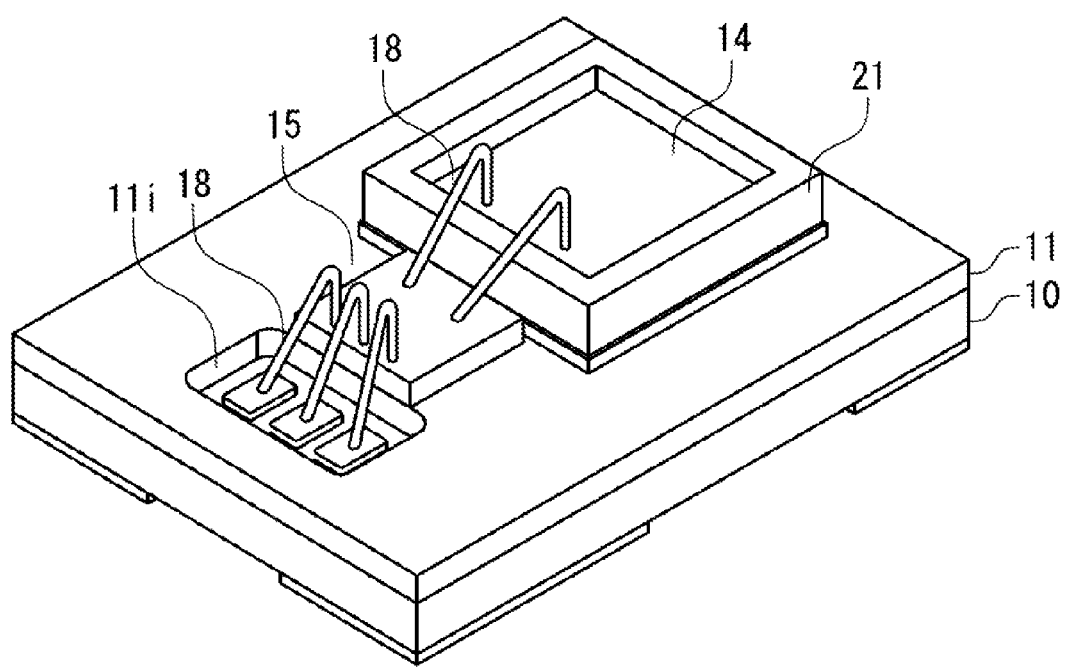
FIG. 6 is a perspective view of the magnetic shielded package according to the first modification example of the first exemplary embodiment.

FIG. 5 is a sectional view of a magnetic shielded package 2 according to a first modification example of the first exemplary embodiment of the invention. In FIG. 5, constituent components which are the same as those shown in in FIG. 1 are given the same reference signs, and redundant description thereon will be omitted. The magnetic shielded package 2 according to this modification example is different from the magnetic shielded package 1 according to the first exemplary embodiment in that a third magnetic shield member 21 is further provided. FIG. 6 is a perspective view of the magnetic shielded package 2 from which the second magnetic shield member 12 is removed.

The third magnetic shield member 21 is disposed on the first magnetic shield member 11. The third magnetic shield member 21 surrounds the pressure detection element 13 and the magnetic device 14 from the four horizontal directions thereof. To allow passage of wirings 18 that connect the pressure detection element 13 to the integrated circuit 15, the third magnetic shield member 21 does not exist over the pressure detection element 13 and the magnetic device 14. Alternatively, part of the third magnetic shield member 21 may be provided over the pressure detection element 13 and the magnetic device 14 in such a region as not to obstruct wire bonding.

The third magnetic shield member 21 is bonded to the first magnetic shield member 11 with a third adhesive 22. Examples of the third adhesive 22 include (i) non-magnetic adhesives (that do not contain magnetic particles) such as silicone, (ii) insulators, and (iii) non-magnetic, conductive adhesives such as silver paste and solder. Since the third magnetic shield member 21 is provided in this manner, the effect of magnetically shielding the magnetic device 14 and its neighborhood can be further enhanced.

How the presence/absence of the third magnetic shield member 21 and the use of a non-magnetic adhesive as the third adhesive 22 influence the magnetic shielding effect will be described below based on results of magnetic field analyses. Comparisons were made between the magnetic shielding effects of a case (1) where the third magnetic shield member 21 is not provided (i.e., magnetic shielded package 1), a case (2) where in the magnetic shielded package 2, the third magnetic shield member 21 is bonded to the first magnetic shield member 11 with the third adhesive 22 that is a non-magnetic adhesive having 50 μm in thickness, and a case (3) where in the magnetic shielded package 2, the third magnetic shield member 21 is bonded to the first magnetic shield member 11 with the third adhesive 22 that is an magnetic-particle containing adhesive having 10 μm in thickness.

The first magnetic shield member 11, the second magnetic shield member 12, and the third magnetic shield member 21 were made of permalloy having 5,000 in relative permeability. The first magnetic shield member 11 and the second magnetic shield member 12 had 0.2 mm in thickness. The first adhesive 16 was an adhesive having 10 μm in thickness and containing magnetic particles having 20 in relative permeability. The opening portions 11h of the first magnetic shield member 11 had the shape shown in FIG. 4C. The third magnetic shield member 21 had 0.5 mm in height. An outer circumference of the third magnetic shield member 21 had a square shape each side of which was 1.2 mm. An inner circumference of the third magnetic shield member 21 had a square shape each side of which was 0.8 mm.

The magnetic shielding effect of the case (1) where the third magnetic shield member 21 was not provided was 49.5 dB. The magnetic shielding effect of the case (2) where in the magnetic shielded package 2, the third magnetic shield member 21 was bonded to the first magnetic shield member 11 with the third adhesive 22 being the non-magnetic adhesive having 50 μm in thickness was 56.5 dB. The magnetic shielding effect of the case (3) where in the magnetic shielded package 2, the third magnetic shield member 21 was bonded to the first magnetic shield member 11 with the third adhesive 22 being the magnetic-particle containing adhesive having 10 μm in thickness was 51.5 dB. That is, the third magnetic shield member 21 enhances the magnetic shielding effect. Particularly, the magnetic shielding effect is better when the non-magnetic adhesive is used as the third magnetic shield member 21 than when a magnetic adhesive is used.

(Second Modification Example of First Exemplary Embodiment)

Figure 7A:
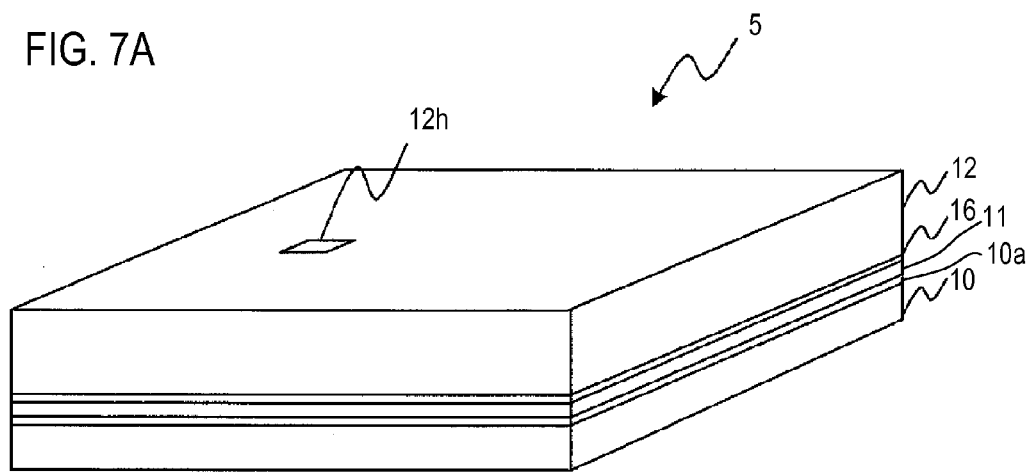
FIGS. 7A and 7B are a magnetic shielded package according to a second modification example of the first exemplary embodiment.
Figure 7B:
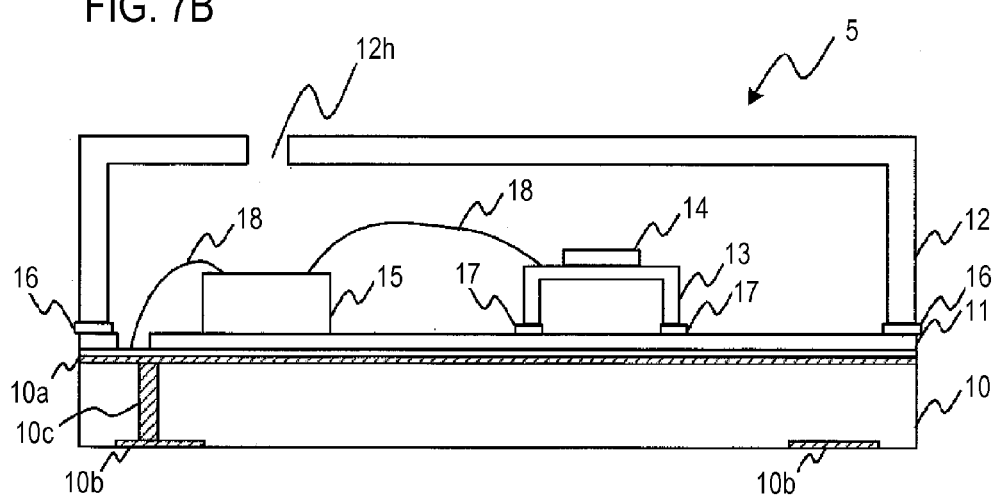

FIGS. 7A and 7B are a perspective view and a sectional view of a magnetic shielded package 5 according to a second modification example of the first exemplary embodiment of the invention, respectively. In FIGS. 7A and 7B, constituent components of the magnetic shielded package 5 which are the same as those in the magnetic shielded package 1 shown in FIG. 1 are given the same reference signs. As shown in FIGS. 7A and 7B, in the magnetic shielded package 5, an opening portion 12h is formed in the second magnetic shield member 12 rather than in the first magnetic shield member 11.

In the magnetic shielded package 5 shown in FIGS. 7A and 7B, the opening portion 12h is formed right over the integrated circuit 15. It should be noted that the position of the opening portion 12h is not limited thereto. Alternatively, the opening portion 12h may be formed anywhere in the second magnetic shield member 12. Processing for forming the opening portion 12h is facilitated if the opening portion 12h is formed in a wall that is not in contact with the first magnetic shield member 11 and at such a position as not to be adjacent to the outer circumference of that wall. The opening portion 12h may have any shape such as a circle, ellipse, polygon, square, rectangle, rhombus, triangle, or a star-like shape. Like the opening portion(s) 11h that have been described above with reference to FIGS. 4A to 4D, the opening(s) 12h may be either a single opening portion or plural opening portions.

The second modification example of the first exemplary embodiment may be combined with the first modification example of the first exemplary embodiment. That is, the third magnetic shield member 21 may be provided in the magnetic shielded package 5 so as to surround the pressure detection element 13 and the magnetic device 14 from the four horizontal directions thereof.

(Second Exemplary Embodiment)

Figure 8:
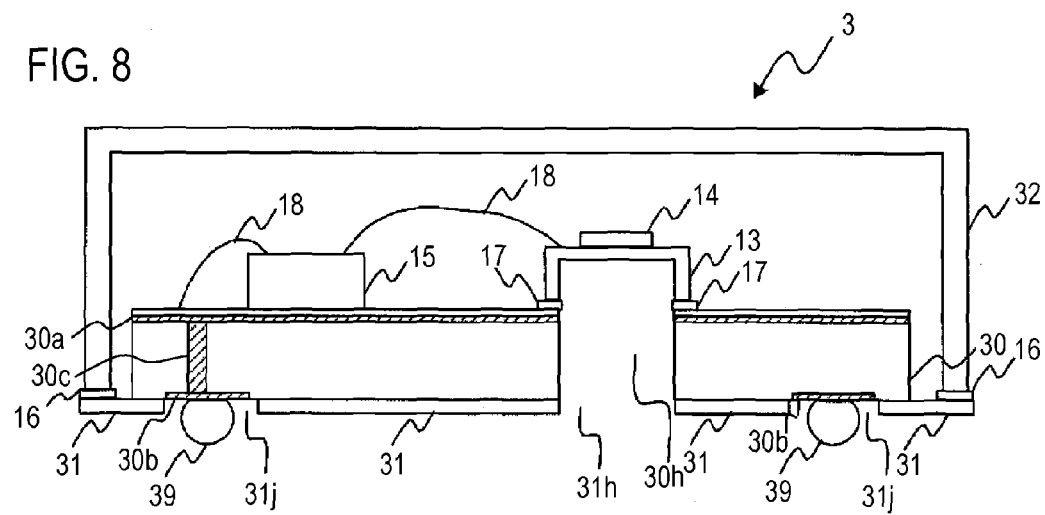
FIG. 8 is a sectional view of a magnetic shielded package according to a second exemplary embodiment of the invention.

FIG. 8 is a sectional view of a magnetic shielded package 3 according to a second exemplary embodiment of the invention. The magnetic shielded package 3 according to the second exemplary embodiment includes a package board 30, a first magnetic shield member 31, a second magnetic shield member 32, a pressure detection element 13, a magnetic device 14, an integrated circuit 15, and solder balls 39. The pressure detection element 13, the magnetic device 14, the integrated circuit 15, and other constituent components having the same as those in the magnetic shielded package 1 according to the first exemplary embodiment are given the same reference signs. Redundant description thereon will omitted In the magnetic shielded package 3, the first magnetic shield member 31 is disposed under the package board 30. The second magnetic shield member 32 surrounds the package board 30 from above and the four horizontal directions thereof. The second magnetic shield member 32 is bonded to the first magnetic shield member 31 with a first adhesive 16. In this manner, the magnetic device 14 is surrounded by the first magnetic shield member 31 and the second magnetic shield member 32. Thereby, the influence of extraneous, unnecessary magnetic noise can be lowered. Furthermore, as described in the first exemplary embodiment, the use of an adhesive that contains, for example, magnetic particles whose relative permeability is equal to or larger than 2 can enhance the magnetic shielding effect thereof.

The package board 30 is provided with solder balls 39 for output electrodes of the magnetic shielded package 3. To this end, opening portions 31j are formed in the first magnetic shield member 31 for insertion of the respective solder balls 39. For example, a diameter of the solder balls 39 is 0.3 mm, and a diameter of the opening portions 31j is 0.6 mm.

The magnetic shielded package 3 may be one that is subjected to insulator surface treatment to prevent short-circuiting with the circuit wiring and increase resistance to corrosion. An example material of the insulator for surface treatment is polyimide.

Figure 9:
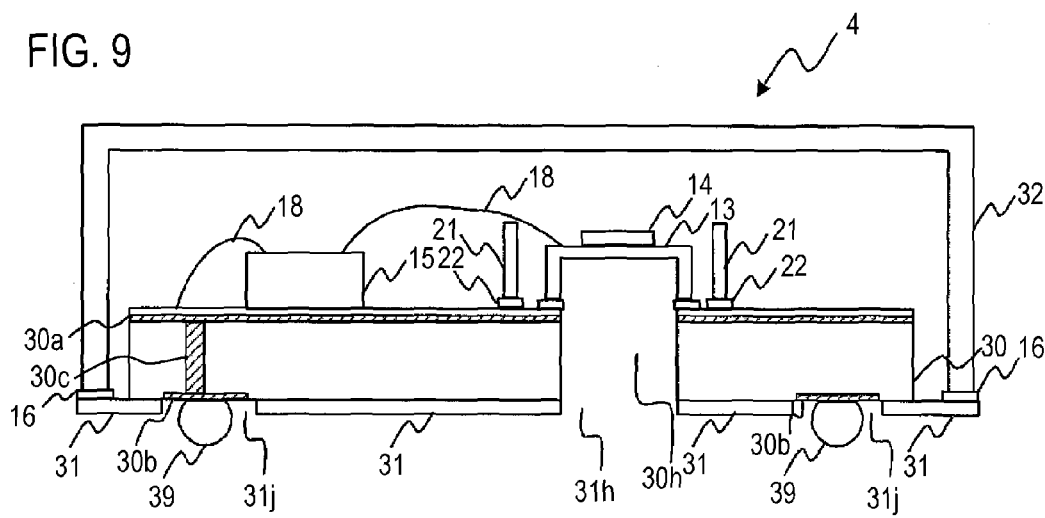
FIG. 9 is a sectional view of a magnetic shielded package according to a first modification example of the second exemplary embodiment.

The second exemplary embodiment can also be modified in the same manners as the first exemplary embodiment. FIG. 9 shows a magnetic shielded package 4 according to a first modification example of the second exemplary embodiment which further includes a third magnetic shield member 21. The third magnetic shield member 21 is disposed on the package board 30 so as to surround the pressure detection element 13 and the magnetic device 14 from the four horizontal directions thereof. The third magnetic shield member 21 is bonded to the package board 30 with a third adhesive 22.

Figure 10:
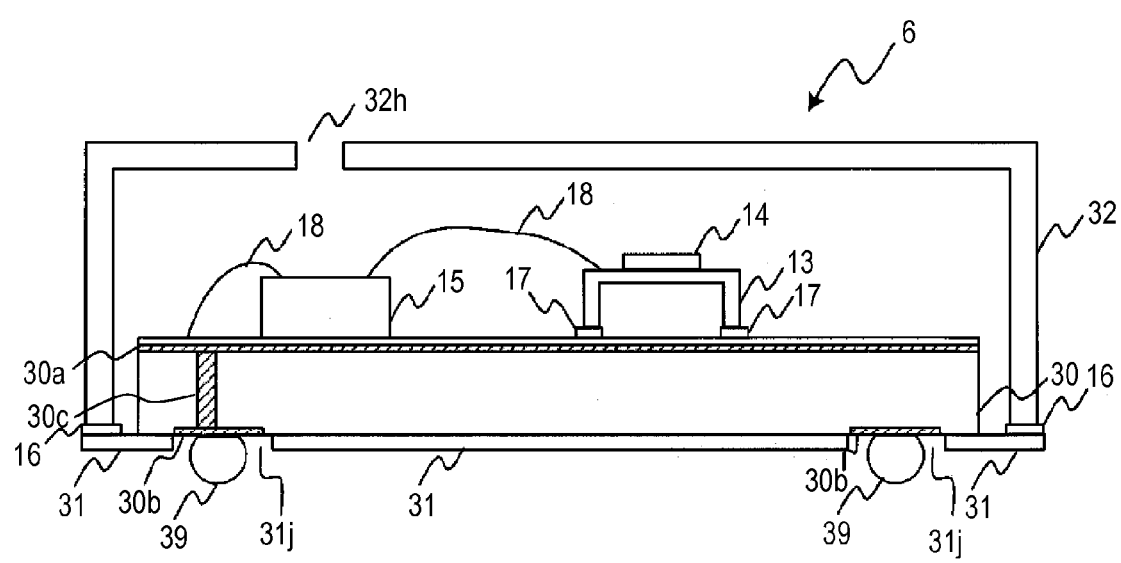
FIG. 10 is a sectional view of a magnetic shielded package according to a second modification example of the second exemplary embodiment.

FIG. 10 shows a magnetic shielded package 6 according to a second modification example of the second exemplary embodiment in which an opening portion 32h is formed in the second magnetic shield member 32. The opening portion 32h may be formed anywhere in the second magnetic shield member 32. The opening portion(s) 32h may be either a single opening portion or plural opening portions and may have any shape. The first and second modification examples of the second exemplary embodiment may be combined with each other.

The several exemplary embodiments of the invention have been described above. It is noted that the above-described exemplary embodiments are just examples and should not be construed as restricting the scope of the invention. Each of these novel exemplary embodiments may be practiced in various other forms. Part of each exemplary embodiment may be omitted, replaced by other elements, or changed in various manners without departing from the spirit and scope of the invention. Modifications of the exemplary embodiments are also included in the invention as claimed and its equivalents.

What is claimed is:

1. A magnetic shielded package comprising:
a substrate;
a magnetic device;
a first magnetic shield member bonded to the substrate to dispose the magnetic device thereon; and
a second magnetic shield member disposed on the first magnetic shield member so as to cover the magnetic device, wherein
an opening portion is formed in the first magnetic shield member (i) at such a position as not to be adjacent to an outer circumference of the first magnetic shield member or (ii) an upper wall of the second magnetic shield member; and
the first magnetic shield member and the second magnetic shield member are bonded to each other with an adhesive that contains magnetic particles.

2. A magnetic shielded package comprising:
a substrate;
a magnetic device;
a first magnetic shield member bonded to the substrate to dispose the magnetic device thereon; and
a second magnetic shield member disposed on the first magnetic shield member so as to cover the magnetic device;
a third magnetic shield member surrounding the magnetic device from four horizontal directions thereof, the second magnetic shield member covering the magnetic device and the third magnetic shield member, wherein an opening portion is formed in the first magnetic shield member (i) at such a position as not to be adjacent to an outer circumference of the first magnetic shield member or (ii) an upper wall of the second magnetic shield member.

3. The package of claim 2, wherein the third magnetic shield member is bonded to the first magnetic shield member with a non-magnetic adhesive.

4. A magnetic shielded package comprising:
a substrate;
a magnetic device;
a pressure detection element on which the magnetic device is disposed;
a first magnetic shield member bonded to the substrate, on which the pressure detection element is disposed, wherein
the first magnetic shield member includes a first opening portion disposed right under the pressure detection element; and
a second magnetic shield member disposed on the first magnetic shield member so as to cover the magnetic device, and
the first magnetic shield member and the second magnetic shield member are bonded to each other with an adhesive that contains magnetic particles.

5. The package of claim 4, further comprising:
a third magnetic shield member surrounding the magnetic device from four horizontal directions thereof, the second magnetic shield member covering the magnetic device and the third magnetic shield member, the board being disposed on the first shield member, and the third magnetic shield member being bonded to the board with a non-magnetic adhesive.

6. The package of claim 4 wherein the substrate includes a second opening portion disposed right under the pressure detection element.

7. The package of claim 6, wherein first openings are formed in the first magnetic shield member so that each of the first openings is smaller in area than the second opening.

8. A magnetic shielded package comprising:
a substrate;
a magnetic device;
a pressure detection element on which the magnetic device is disposed;
a first magnetic shield member bonded to the substrate, on which the pressure detection element is disposed;
a third magnetic shield member surrounding the magnetic device from four horizontal directions thereof, the second magnetic shield member covering the magnetic device and the third magnetic shield member, wherein
the first magnetic shield member includes a first opening portion disposed right under the pressure detection element; and
a second magnetic shield member disposed on the first magnetic shield member so as to cover the magnetic device.

9. The package of claim 8, wherein the third magnetic shield member is bonded to the first magnetic shield member with a non-magnetic adhesive.

* * * * *